United States Patent
Mizusako et al.

(10) Patent No.: US 7,593,438 B2
(45) Date of Patent: Sep. 22, 2009

(54) DRIVING METHOD FOR LASER LIGHT SOURCE DEVICE, LASER LIGHT SOURCE DEVICE, IMAGE DISPLAY DEVICE, MONITOR DEVICE, AND ILLUMINATION DEVICE

(75) Inventors: Kazuhisa Mizusako, Chino (JP); Kiyoto Sudo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/987,101

(22) Filed: Nov. 27, 2007

(65) Prior Publication Data
US 2008/0130693 A1     Jun. 5, 2008

(30) Foreign Application Priority Data
Nov. 30, 2006   (JP)   ............... 2006-323419

(51) Int. Cl.
    *H01S 3/10* (2006.01)
(52) U.S. Cl. .............. 372/21; 372/22; 372/29.014
(58) Field of Classification Search .......... 372/21, 372/22
    See application file for complete search history.

(56) References Cited

U.S. PATENT DOCUMENTS

| 5,020,063 | A  | * | 5/1991 | Okada ............ 372/34 |
| 5,617,435 | A  |   | 4/1997 | Nagai et al. |
| 2004/0066807 | A1 | * | 4/2004 | Kasazumi et al. ....... 372/22 |

FOREIGN PATENT DOCUMENTS

| JP | A-4-318528 | 11/1992 |
| JP | A-7-318996 | 12/1995 |
| JP | A-11-307859 | 11/1999 |
| JP | A-2000-228552 | 8/2000 |
| JP | A-2001-25888 | 1/2001 |
| JP | A-2003-298160 | 10/2003 |

* cited by examiner

*Primary Examiner*—Dung T Nguyen
(74) *Attorney, Agent, or Firm*—Oliff & Berridge, PLC (57) ABSTRACT

A driving method for laser light source device includes: providing a laser light source device including a laser light source, a wavelength conversion element converting the wavelength of the light emitted from the laser light source, and a resonator mirror constituting a resonator structure between the laser light source and the resonator mirror; and driving the laser light source so as to cause the amount of light to decrease depending on the passage of time, compared with the amount of light by the initial driving of the laser light source.

13 Claims, 7 Drawing Sheets

—— THE EMBODIMENT OF THE INVENTION
----- LOW DRIVE CURRENT (COMPARATIVE EXAMPLE 2)
—— HIGH DRIVE CURRENT (COMPARATIVE EXAMPLE 1)

DRIVING METHOD FOR LASER LIGHT SOURCE DEVICE, LASER LIGHT SOURCE DEVICE, IMAGE DISPLAY DEVICE, MONITOR DEVICE, AND ILLUMINATION DEVICE

CROSS-REFERENCE TO RELATED APPLICATION

This application is based on and claims priority from Japanese Patent Application No. 2006-323419, filed on Nov. 30, 2006, the contents of which are incorporated herein by reference.

BACKGROUND

1. Technical Field

The present invention relates to a driving method for a laser light source device, a laser light source device, an image display device, a monitor device, and an illumination device.

2. Related Art

As a light source used for a projection-type image display device, a discharge lamp (e.g., extra-high-pressure mercury lamp) is generally used.

However, in such a discharge lamp, there is a problem in that the lifetime of the discharge lamp is comparatively short, the scope of color reproducibility is narrow, or the like.

In recent years, a projection-type image display device that includes a laser light source emitting a monochromatic light has been proposed instead of the discharge lamp.

The laser light source is used in combination with a wavelength conversion element (second-harmonic generation element (SHG)) that obtains light having a half-wavelength of the emitted light.

In the above-described wavelength conversion element, there is a problem in that the scope of the temperature acceptability is narrow, furthermore, in that it is impossible to obtain stabilized output when the temperature condition is varied due to the influence of an ambient temperature.

As disclosed in Japanese Unexamined Patent Application, First Publication No. 2000-228552, a laser device that obtains stabilized laser output has been proposed In the laser device, a mechanism for detecting and controlling the temperature is formed, and the temperature of the resonator including the wavelength conversion element is varied in accordance with an ambient temperature, for example, using a Peltier element.

As described above, since the scope of the temperature acceptability of the wavelength conversion element is narrow, the wavelength conversion element does not operate desirably until the temperature of the wavelength conversion element reaches a predetermined temperature (constant value). Therefore, desired laser light can not be obtained.

Furthermore, in the case of using the laser light as the light source of the projection-type image display device, it is desirable to obtain quick illumination of the laser light.

If the temperature of the wavelength conversion element is controlled to be a predetermined value using the Peltier element, it is possible to obtain a desired laser light.

However, in the Peltier element, there are problems in that it takes time for the temperature of the wavelength conversion element to reach a predetermined temperature, and it is difficult to obtain desired laser light in a short time.

Also, it is possible for the wavelength conversion element to be directly heated by using a heater instead of the above-described Peltier element. However, there are problems in that the overshoot amount of temperature in relative to a predetermined temperature occurs due to an upsurge of the temperature. As a result, it takes time for the temperature of the wavelength conversion element to stabilize at a predetermined temperature.

SUMMARY

An advantage of some aspects of the invention is to provide a driving method for a laser light source device, a laser light source device, an image display device, a monitor device, and an illumination device, in which it is possible to obtain a desired amount of light in a short time.

A first aspect of the invention provides a driving method for a laser light source device, including: providing a laser light source device including a laser light source, a wavelength conversion element converting the wavelength of the light emitted from the laser light source, and a resonator mirror constituting a resonator structure between the laser light source and the resonator mirror; and driving the laser light source so as to cause the amount of light to decrease depending on the passage of time, compared with the amount of light by the initial driving of the laser light source.

The light emitted from the laser light source can be controlled by the electric current and voltage supplied to the laser light source.

In the driving method for the laser light source device of the first aspect of the invention, the wavelength conversion element is heated by the light emitted from the laser light source to which the electric current of the initial driving is supplied. In the wavelength conversion element, the amount of that the temperature increases beyond the predetermined temperature (hereinafter, referred to as overshoot amount) occurs after reaching the predetermined temperature. The wavelength conversion element is in a stable state.

At this time, the laser light source is driven so as to cause the electric current supplied to the laser light source to decrease depending on the passage of time, compared with the electric current by the initial driving of the laser light source. Therefore, the above-described overshoot amount of temperature is reduced, and it is possible to cause the temperature of the wavelength conversion element to reach the predetermined temperature and stable state (stationary state) in a fisher short time.

Thus, the wavelength conversion element in which an allowable range of the driving temperature is narrow can speedily be in the usable state. Also, it is possible to quickly illuminate the laser light, that is, it is possible to obtain the desired amount of light in a short time.

It is preferable that the driving method of the first aspect of the invention further include using a heater to heat the wavelength conversion element when the driving of the laser light source.

In the case of the temperature control only by heater, it takes time for the temperature of the wavelength conversion element to reach the predetermined temperature.

In the driving method for the laser light source device of the first aspect of the invention, by utilizing the heating of the heater, it is possible to cause the temperature of the wavelength conversion element to reach the predetermined temperature in a short time. Also, it is possible to obtain the desired laser light in a further short time It is preferable that, in the driving method of the first aspect of the invention, the driving of the heater be controlled in accordance with the light emitted from the laser light source.

In this manner, for example, the calorific value of the heater is set at a high value until the temperature of the wavelength conversion element reaches the predetermined temperature.

Since the calorific value of the heater is reduced similar to the light emitted from the laser light source until the temperature of the wavelength conversion element stabilizes at the predetermined temperature, it is possible to obtain the desired laser light in a further short time.

It is preferable that the driving method of the first aspect of the invention further include detecting the temperature of the wavelength conversion element. In the driving method, the detecting of the temperature of the wavelength conversion element is started when a predetermined electric current is supplied to the laser light source at the initial driving of the laser light source. Also, in the driving method, the supply of the electric current to the light source is decreased before the temperature of the wavelength conversion element reaches a predetermined temperature.

In this manner, for example, when the temperature of the wavelength conversion element reaches the predetermined temperature, the amount of supply of electric current supplied to the laser light source is reduced. Therefore, it is possible to suppress the overshoot amount of temperature and to speedily converge the temperature at the predetermined temperature and it is possible to obtain quick illumination of the laser light.

It is preferable that the driving method of the first aspect of the invention further include measuring the amount of light emitted from the resonator structure. In the driving method, the measuring of the amount of light is started when a predetermined electric current is supplied to the laser light source at the initial driving of the laser light source. Also, in the driving method, the supply of the electric current to the light source is decreased when the light emitted from the resonator structure is initially detected after the initial driving of the laser light source.

When the temperature of the wavelength conversion element reaches the predetermined temperature as described above, the wavelength of the light emitted from the laser light source is converted. The light of the converted wavelength is emitted from the resonator structure.

That is, in the case in which the light emitted from the resonator structure is initially detected after the initial driving of the laser light source, it means that the temperate of the wavelength conversion element reaches the predetermined temperature.

Therefore, in this manner, after the temperature of the wavelength conversion element reaches the predetermined temperature, due to reducing the amount of supply of electric current supplied to the laser light source, the overshoot amount of temperature is suppressed, and the temperature is speedily converged at the predetermined temperature. Thus, it is possible to obtain quick illumination of the laser light Furthermore, when the laser light source device is driven the management of the temperature of the wavelength conversion element is not required. Therefore, it is possible to easily control the laser light source device.

It is preferable that, in the driving method of the first aspect of the invention, after the temperature of the wavelength conversion element has been in a stationary state at the desired temperature, a temperature controlling section formed at the wavelength conversion element is driven, and the temperature of the wavelength conversion element is controlled.

When the temperature of the wavelength conversion element is in a stationary state at the desired temperature, the amount of light emitted from the resonator structure increases. As a result, the amount of light passed through the interior of the wavelength conversion element is reduced. Therefore, the temperature of the wavelength conversion element itself is lowered.

Due to adopting the above-described constitution, the temperature controlling section formed at the wavelength conversion element, for example, a heater is used, and the wavelength conversion element is heated. Therefore, the temperature of the wavelength conversion element can be conserved, and it is possible to maintain the desired laser emission.

A second aspect of the invention provides a laser light source device including: a laser light source; a wavelength conversion element converting the wavelength of the light emitted from the laser light source; a resonator mirror constituting a resonator structure between the laser light source and the resonator mirror, and a control section controlling the light emitted from the laser light source so as to cause the amount of light to decrease depending on the passage of time, compared with the amount of light by the initial driving of the laser light source.

In the light source device of the second aspect of the invention, the wavelength conversion element is heated by the laser light emitted from the laser light source to which the electric current of the initial driving is supplied. In the wavelength conversion element, the overshoot amount of temperature occurs after reaching the predetermined temperature. The wavelength conversion element is in a stable state.

At this time, the control section causes the electric current supplied to the laser light source to decrease depending on the passage of time, compared with the electric current by the initial driving of the laser light source. Also, the laser light source is driven by the control section. Therefore, the above-described overshoot amount of temperature is reduced, and it is possible to cause the temperature of the wavelength conversion element to reach the predetermined temperature and stable state (stationary state) in a further short time.

Thus, the wavelength conversion element in which an allowable range of the driving temperature is narrow can speedily be in the usable state. Also, it is possible to quickly illuminate the laser light, that is, it is possible to obtain the desired amount of light in a short time.

A third aspect of the invention provides an image display device including: the laser light source device described above; a light modulation device modulating the light emitted from the laser light source device in accordance with an image signal; and a projection device projecting an image formed by the light modulation device.

Since the image display device of the third aspect of the invention includes the laser light source device in which it is possible to obtain the desired amount of light in a short time, it is possible to quickly display images in the image display device itself A fourth aspect of the invention provides a monitor device including: a main body having the laser light source device described above; and a light transmission section transmitting the light emitted from the main body to an exterior of the light transmission section, and transmitting reflected light of the exterior of the light transmission section to the main body.

Since the monitor device of the fourth aspect of the invention includes the laser light source device in which it is possible to obtain the desired amount of light mi a short time, it is possible to quickly illuminate onto an object by the light transmission section. Therefore, in the monitor device, it is possible to quickly capture the taken images by the light transmission section, achieving a high performance.

A fifth aspect of the invention provides an illumination device including: the laser light source device described above; and a diffusing element diffusing laser light Since the illumination device of the fifth aspect of the invention includes the laser light source device in which it is possible to obtain the desired amount of light in a short time, it is possible to quickly illuminate the desired amount of light, achieving a high reliability.

DESCRIPTION OF EXEMPLARY EMBODIMENTS

Hereinafter, embodiments of the invention will be described with reference to the accompanying drawings.

The embodiments explained hereinafter are only for illustrating certain modes in which the invention may be implemented, and are not limitative of the invention.

The scale of each member in the drawings below has been changed appropriately to sizes that enable each member to be recognized easily.

Figure 1:
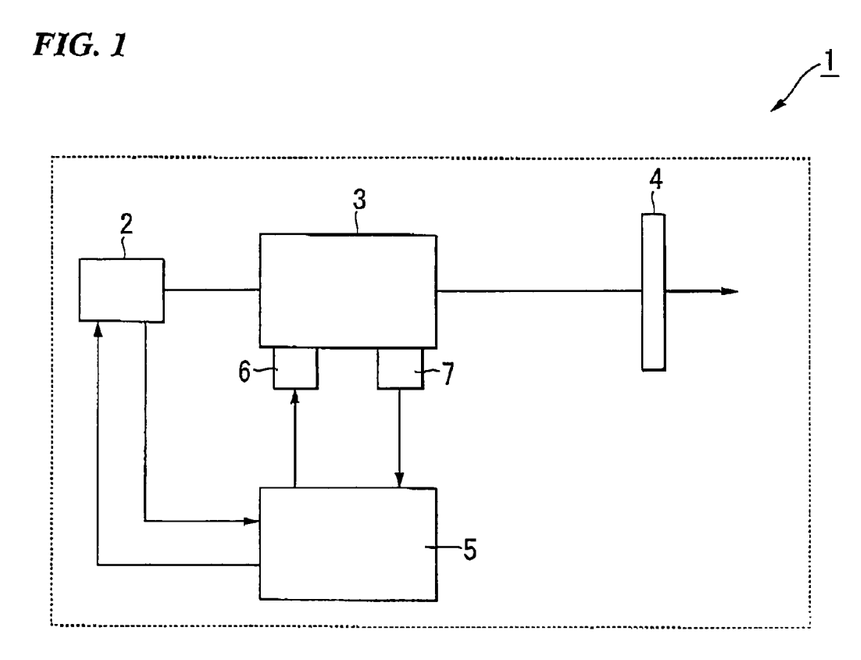
FIG. 1 is a block diagram of a laser light source device of an embodiment of the invention.

As shown in FIG. 1, a laser light source device 1 of this embodiment includes: a laser light source 2, a wavelength conversion element 3 for converting the wavelength of the light emitted from the laser light source 2, and a resonator mirror 4 constituting a resonator structure between the laser light source 2 and the resonator mirror 4.

The laser light source 2 includes a semiconductor substrate. In the laser light source 2, the laser light is emitted from the surface of the semiconductor substrate. The laser light source 2 includes a semiconductor laser element having the features in that the emitting angle of the laser light is isotropic and at a low angle. In this embodiment, a semiconductor laser element in which it is possible to emit infrared laser light is used.

The wavelength conversion element (a second-harmonic generation element, SHG) 3 is a nonlinear optical element which converts the wavelength of the incident light into substantially half-wavelength light.

Thus, the wavelength of the light which is emitted from the laser light source 2 toward the resonator mirror 4 is converted into substantially half-wavelength light due to passing through the wavelength conversion element 3.

The resonator mirror 4 constitutes a laser resonator between the laser light source 2 and the resonator mirror 4. The light emitted from the laser light source 2 is repeatedly reflected between the laser light source 2 and the resonator mirror 4. Thereby, the light is amplified. After the amplification, the light is emitted from the resonator mirror 4 as laser light.

Furthermore, the laser light source device 1 includes a control section 5. The control section 5 controls driving of the laser light source device 1.

The control section 5 constitutes a part of a driving circuit (driver) for driving the laser light source 2. The control section 5 includes a processing circuit, for example, such as DSP, PLD, LPLD, FPGA, or the like.

A power supply (not shown) such as a DC/DC power supply is electrically connected to the control section 5. The current is supplied to the laser light source 2 via the control section 5.

The operation of the control section 5 is explained below, however the control section 5 controls so as to cause the current supplied to the laser light source 2 to decrease depending on the passage of time, compared with the initial driving.

Furthermore, the laser light source device 1 includes a heater 6 and a thermistor 7 that are disposed at the wavelength conversion element 3. The heater 6 controls the temperature of the wavelength conversion element 3. The thermistor 7 detects the temperature of the wavelength conversion element 3.

As a temperature controlling section and as a temperature detection section, the heater or thermistor described above is not limited. Various types of the temperature controlling section and temperature detection section which are commonly well-known can be adopted.

The heater 6 and the thermistor 7 are electrically connected with the above-described control section 5.

In general, the scope of the temperature acceptability is narrow in the wavelength conversion element. Also, if the temperature of the wavelength conversion element will not reach the desired temperature (hereinafter, referred to as predetermined temperature), it is impossible to convert the wavelength of the light emitted from the laser light source into a desired wavelength.

Therefore, until the temperature of the wavelength conversion element reaches the predetermined temperature, the wavelength of the light is not converted, and the desired laser output can not obtained.

In order to solve the above-described problems, a phenomenon in that a part of the laser light is converted into thermal energy was found. As the constitution in which the temperature of the wavelength conversion element 3 is caused to reach the predetermined temperature, the heater 6 and the light emitted from the laser light source 2 are used in the laser light source device 1 of this embodiment of the invention.

Thus, as described below, the laser light source device 1 includes the features in that the laser light source 2 is driven so as to cause the light emitted from the laser light source 2 to decrease depending on the passage of time, compared with the light by the initial driving.

The light emitted from the laser light source can be controlled by the current and voltage supplied to the laser light source 2.

Thus, for example, in order to decrease the amount of light emitted from the laser light source, at least one of the current or the voltage, which are supplied to the laser light source, may be decreased.

The laser light source which is pulse-driven may be generally used. Also, for example, the method for decreasing the peak value of the current, the method for decreasing the average value of the current, or the method for switching the driving of the laser light source from steady drive to pulsed drive, may be used. Due to these methods, it is possible to decrease the amount of light emitted from the laser light source 2.

In the explanation as described below, the amount of light emitted from the laser light source is decreased due to controlling the value of the current supplied to the laser light source 2 (due to decreasing the value of the current supplied to the laser light source 2).

Figure 3:
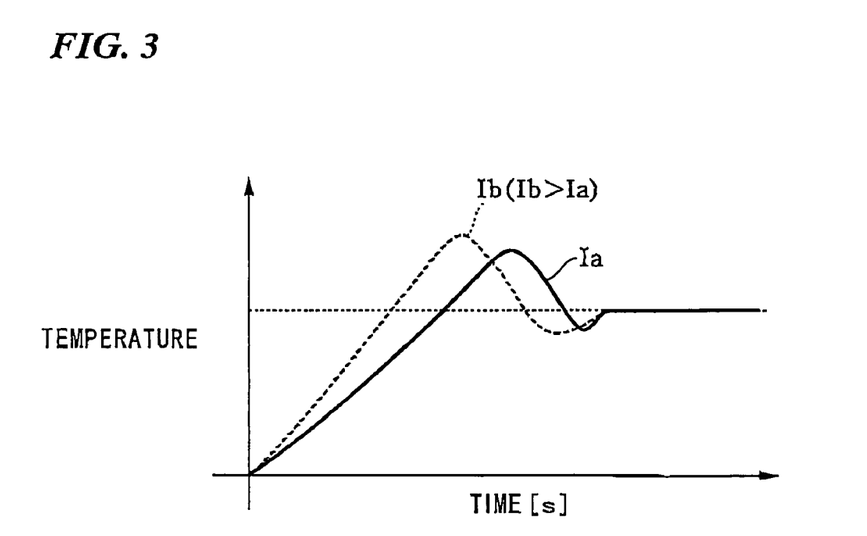
FIG. 3 is a view showing the characteristic between the amount of input current and the amount of light in the laser light source.

FIG. 3 is a view showing the result of the measurement of the characteristic of the temperature of the wavelength conversion element 3. In FIG. 3, the characteristic of the temperature is shown due to a difference of the drive current input to the laser light source 2.

In FIG. 3, the axis of the ordinate means the temperature of the wavelength conversion element 3, and the axis of abscissa means time for inputting the current. The broken line shown in FIG. 3 indicates an acceptable temperature (predetermined temperature) at which the wavelength conversion element is desirably operated.

In FIG. 3, comparing the case of inputting the current Ib higher than the current Ia (Ib>Ia) to the laser light source 2, with the case of inputting the current Ia to the laser light source 2, it is possible to cause the temperature of the wavelength conversion element 3 to reach the predetermined temperature in a short time, due to the current Ib being higher than the current Ia.

The wavelength conversion element 3 can not desirably convert the wavelength of the light emitted from the laser light source 2 into the predetermined wavelength until the temperature of the wavelength conversion element 3 reaches the predetermined temperature (period for initial driving) as described above. Therefore, the light passed through the wavelength conversion element 3 is reflected by the resonator mirror 4.

The reflected light is passed through the wavelength conversion element 3, the light is reflected at the laser light source 2, and the light is incident into the wavelength conversion element 3 again.

Therefore, the wavelength conversion element 3 can be heated by utilizing the thermal energy into which the light emitted from the laser light source 2 is inverted, and by the heating of the heater 6, until the temperature of the wavelength conversion element 3 reaches the predetermined temperature.

Figure 2:
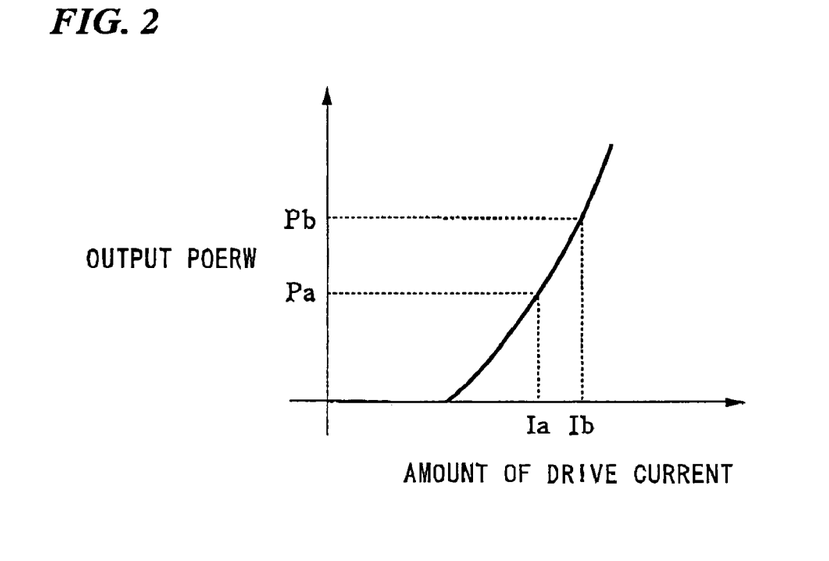
FIG. 2 is a view showing a simulation result of the characteristic of the temperature of the wavelength conversion element.

FIG. 2 is a view showing the characteristic of the relationship between the amount of drive current (amount of supply of the current) and the output power (amount of light) in the laser light source 2.

In FIG. 2, the axis of the ordinate means the output power, and the axis of abscissa means the input current value.

As shown in FIG. 2, the laser light source 2 can obtain high output power, that is, a great amount of light, depending on the amount of drive current.

As shown in FIG. 3, in the case of heating the wavelength conversion element 3, the overshoot amount of temperature increases depending on the rate of increase of the temperature change. Therefore, it takes time until the temperature of the wavelength conversion element 3 stabilizes at the predetermined temperature indicated by the broken line in FIG. 3.

As a result, in the case of inputting the high drive current Ib, though the temperature of the wavelength conversion element 3 reaches the predetermined temperature in a short time, the length of time until the temperature of the wavelength conversion element 3 stabilizes at the predetermined temperature is the same as the length of time for the low drive current Ia to be input In the below explanation, the period is referred to as "stabilization period", that is, from the point of the temperature of the wavelength conversion element 3 reaching the predetermined temperature at first, to the point of the temperature of the wavelength conversion element 3 stabilizing at the predetermined temperature.

Also, the state is referred to as "stationary state", that is, the laser light source can actually operate after the temperature of the wavelength conversion element 3 has stabilized at the predetermined temperature.

In this embodiment, in order to solve the problems described above and to effectually utilize the light emitted from the laser light source 2 to the heating the wavelength conversion element 3, the control section 5 controls the laser light source 2 so as to cause the current supplied to the laser light source 2 to decrease depending on the passage of time, compared with the initial driving.

Therefore, in the laser light source device 1 of this embodiment, the temperature data of the wavelength conversion element 3 detected by the thermistor 7 or the data of the heater 6 is fed back to the control section 5.

Therefore, the control section 5 can determine whether or not the temperature of the wavelength conversion element 3 has reached the predetermined temperature.

Based on the feedback from the thermistor 7 and the heater 6 to the control section 5, the control section 5 controls to decrease the amount of current supplied to the laser light source 2, before or when the temperature of the wavelength conversion element 3 has reached the predetermined temperature.

Specifically, in the explanation of the driving method for a laser light source device described below, controlling the temperature of the wavelength conversion element 3 is mainly described.

The heater 6 starts to heat the wavelength conversion element 3 when the driving of the laser light source 2 is started.

The heater 6 is regulatively driven at the initial driving. After the initial driving of the laser light source, the heater 6 is controlled, for example, controlled so as to vary the heating of the heater 6, depending on the light emitted from the laser light source 2.

It is desirable that, due to the heater 6, the wavelength conversion element 3 be greatly heated at the initial state, the wavelength conversion element 3 be heated so as to stabilize the temperature thereof at the predetermined temperature at the stabilization period, and the wavelength conversion element 3 be controlled so as to maintain the temperature at the stationary state.

Figure 4:
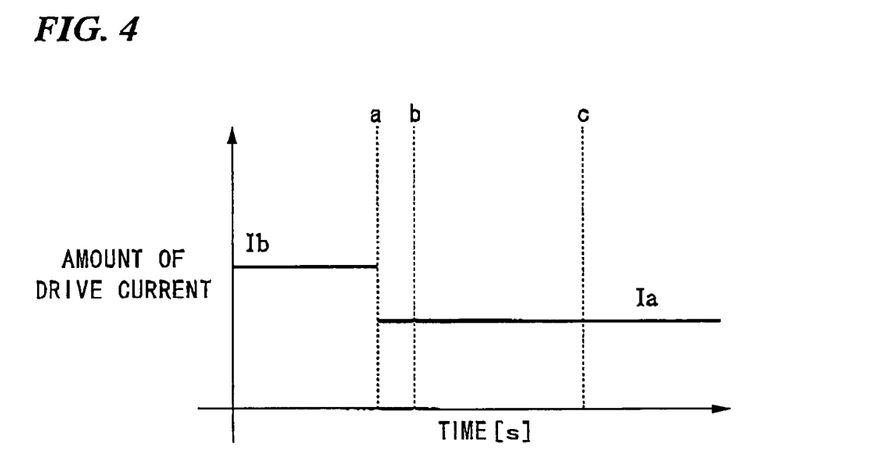
FIG. 4 is a view showing the drive condition of the laser light source device.

FIG. 4 is a view showing the drive condition of the laser light source device 1 of this embodiment.

In FIG. 4, the axis of the ordinate means the amount of drive current supplied to the laser light source 2, and the axis of abscissa means the passage of time.

Figure 5:
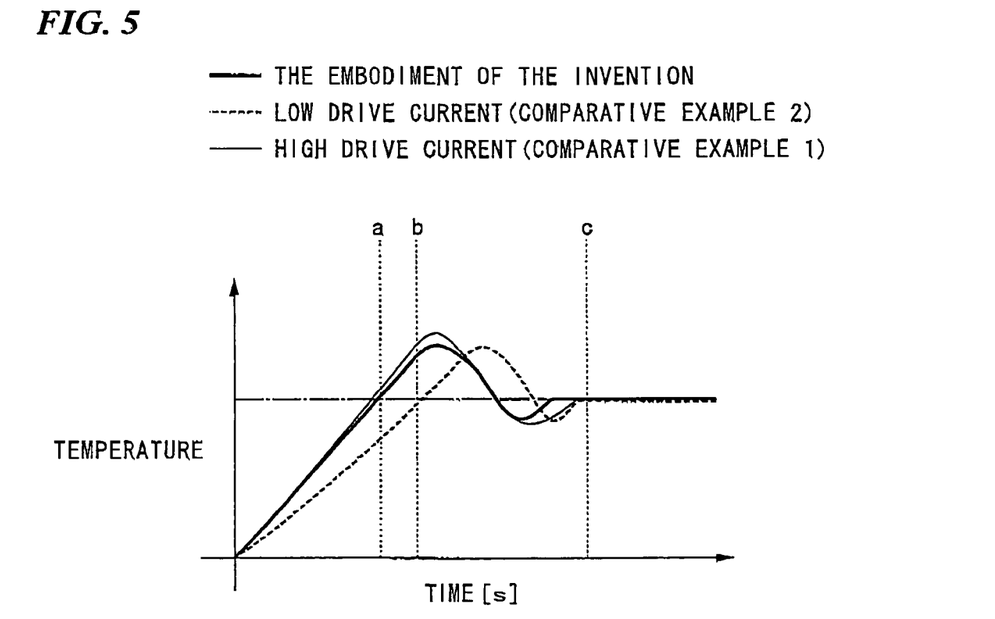
FIG. 5 is a view showing the temperature characteristics of a wavelength conversion element corresponding to the drive condition shown in FIG. 4

Furthermore, FIG. 5 is a view showing the characteristic of the temperature of the wavelength conversion element 3. In FIG. 5, the characteristic of the temperature of the wavelength conversion element 3 is changed by driving the laser light source 2 at the drive condition shown in FIG. 4, including the temperature change by the heating of the heater 6.

In FIG. 5, the axis of the ordinate means the temperature of the wavelength conversion element 3, and the axis of abscissa means the passage of time.

The one dotted line shown in FIG. 5 indicates the predetermined temperature of the wavelength conversion element 3.

In the FIGS. 4 and 5, the broken lines a, b, and c pointed on the axis of abscissa of FIG. 4 are in accordance with the broken lines a, b, and c pointed on the axis of abscissa in FIG. 5, respectively. Thus, the broken lines a, b, and c pointed on the axis of abscissa in FIGS. 4 and 5 are indicated on the identical axis of the passage of time.

Firstly, comparative examples 1 and 2 are explained

In the comparative example 1, the high drive current Ib alone as shown in FIG. 3 is input to the laser light source 2 of the laser light source device 1. In this case, the temperate of the wavelength conversion element 3 reaches the predetermined temperature at the time which is substantially identical to (earlier than) the time indicated by the broken line a in FIG. 5.

In the comparative example 2, the low drive current Ia alone as shown in FIG. 3 is input to the laser light source 2 of the laser light source device 1. In this case, the temperature of the wavelength conversion element 3 reaches the predetermined temperature at the time indicated by the broken line b in FIG. 5.

Furthermore, in the comparative examples 1 and 2, the temperature of the wavelength conversion element 3 is maintained at the predetermined temperature in the stable state (stationary state), at the time indicated by the broken line c in FIG. 5.

Therefore, in the case of the comparative examples 1 and 2, that is, the case of the laser light source device in which the driving method of the invention is not used, the period from the stating of supply of the driving current to the time indicated by the broken line a means the initial state. Also, the period from the time indicated by the broken line a to the time indicated by the broken line c means the stabilization period Also, the period after the time indicated by the broken line c means the stationary state.

In the comparative example 1 as described above, the temperature of the wavelength conversion element 3 reaches the predetermined temperature at the time which is substantially identical to the time indicated by the broken line a in FIG. 5. On the other hand, as described below, the high drive current Ib is input to the laser light source 2 until it takes the time indicated by the broken line a, and the temperature of the wavelength conversion element 3 reaches the predetermined temperature at the time indicated by the broken line a. In the case of the comparative example 1 as shown in FIG. 5, the time at which the temperature of the wavelength conversion element 3 reaches the predetermined temperature is shifted from the time indicated by the broken line a. However, in the case of the comparative example 1, the high drive current Ib is supplied to the laser light source 2 during the period identical to the embodiment of the invention. Therefore, in fact, the temperature of the wavelength conversion element 3 reaches the predetermined temperature at the time indicated by the broken line a, that is, at the time identical to the embodiment of the invention.

Next, the embodiment of the invention is explained.

In the laser light source device 1 of the embodiment of the invention, as shown in FIG. 4, until the wavelength conversion element 3 reaches the predetermined temperature (staring of supply of the driving current to the time indicated by the broken line a), the drive current Ib predetermined and regulated current) is input to the laser light source 2.

The signal of the effect that the temperature of the wavelength conversion element 3 has reached the predetermined temperature or the signal of the effect that the temperature of the wavelength conversion element 3 has adjacently reached the predetermined temperature, is sent from the thermistor 7 to the control section 5.

Based on the signal, the control section 5 causes to the current supplied to the laser light source 2 to switch the drive current Ia from the drive current Ib Therefore, the amount of supply of current to the laser light source 2 decreases when the temperature of the wavelength conversion element 3 reaches the predetermined temperature.

In this manner, due to the driving method described above, it is possible to cause the temperature of the wavelength conversion element 3 to reach the predetermined temperature in the period identical to the case in which the high drive current Ib is continuously input to the laser light source 2, as shown in FIG. 5 in the laser light source device 1 of the embodiment of the invention. Also, since the overshoot amount of temperature is quickly suppressed and converged at the predetermined temperature, it is possible to cause the wavelength conversion element 3 to reach the predetermined temperature in a short time and in the stationary state.

The invention is not limited to the above-described method, for example, prior to the temperature of the wavelength conversion element 3 reaching the predetermined temperature, the amount of supply of current to the laser light source 2 may be decreased.

If the amount of light emitted from the laser light source 2 accordingly decreases depending on the passage of time compared with the amount of light by the initial driving, it is possible to obtain the similar effects.

As described above, when the temperature of the wavelength conversion element 3 reaches the determined temperature, the wavelength conversion element 3 desirably converts the wavelength of the light emitted from the laser light source 2 into the predetermined wavelength. The light having the inverted wavelength is emitted from the resonator mirror 4 to the exterior of the laser light source device 1.

Furthermore, in the laser light source device 1, after the wavelength conversion element 3 was in the stationary state, the wavelength conversion element 3 is heated by the heater 6, compared with the stationary state.

Specifically, after the wavelength conversion element 3 was in the stationary state, the amount of laser light emitted from the resonator mirror 4 increases, and the amount of light passed through the wavelength conversion element 3 decreases. Therefore, there is a concern that the temperature of the wavelength conversion element 3 decreases.

In order to solve the concern in this embodiment, when the control section 5 determines the effect that the wavelength conversion element 3 is in the stationary state due to the signal detected by the thermistor 7, the heater 6 is driven by the control section 5 and the wavelength conversion element 3 is further heated.

Therefore, it is possible to constantly maintain the temperature of the wavelength conversion element 3 after the driving, and it is possible to continuously maintain the emission of the laser light.

In the laser light source device 1 of this embodiment, the laser light source 2 is driven by the current (Ib) supplied at the initial driving, and the wavelength conversion element 3 is heated.

In the wavelength conversion element 3, the overshoot amount of temperature occurs after reaching the predetermined temperature, the temperature is in stable state.

At this time, the current supplied to the laser light source 2 is caused by the control section 5 so as to decrease depending on the passage of time, compared with the supply of the current (Ib) of the initial driving. That is, the amount of current is set at the amount of low drive current Ia. Therefore, the overshoot amount of temperature is reduced, and it is possible to cause the temperature of the wavelength conversion element 3 to reach the predetermined temperature and stable state (stationary state) in a further short time.

Specifically, due to decreasing the amount of light emitted from the laser light source (the supply of the current and voltage to the laser light source 2) depending on the passage of time compared with the initial driving, the wavelength conversion element 3 is in the stationary state. The laser light source device 1 can actually operate.

Therefore, it is possible to cause the wavelength conversion element 3 in which an allowable range of the driving temperature is narrow to quickly be in the usable state. Also, it is possible to obtain the quick illumination of the laser light, that is, the desired amount of light in a short time.

Modified Example

Figure 6:
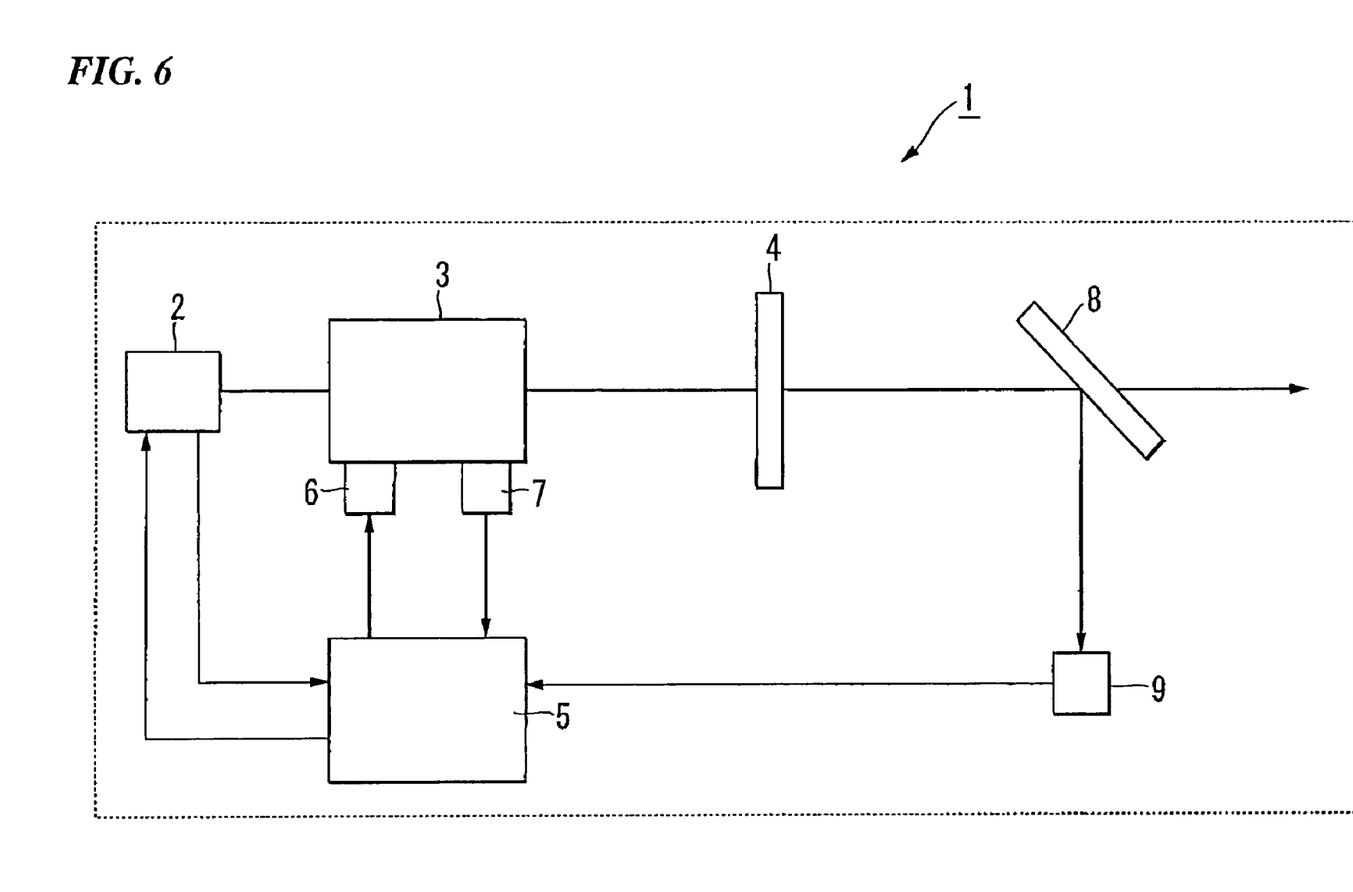
FIG. 6 is a view showing a modified example of the driving method for a laser light source device.

Hereinafter, a modified example of the driving method of the above-described laser light source device 1 is explained In this modified example, as shown in FIG. 6, the laser light source device 1 includes a photo-diode 9. The photo-diode 9 measures the amount of light whose wavelength is inverted by the wavelength conversion element 3 and emitted from the resonator mirror 4, that is, the light emitted from the resonator structure.

A part of the light emitted from the resonator mirror 4 is reflected toward the photo-diode 9 by a beam splitter, and the light permeated through the beam splitter 8 is emitted as the laser light In the above-described embodiment, due to the thermistor formed at the wavelength conversion element 3, the temperature of the wavelength conversion element 3 is measured, that is, whether or not the temperature has reached the predetermined temperature is measured.

In this modified example, after the initial driving of the laser light source 2, when the photo-diode 9 primarily detects the light emitted from the resonator structure (the laser light emitted from the resonator mirror 4), that is, when there is primal feedback from the photo-diode 9, the control section 5 controls the supply of the current to the laser light source 2 so as to decrease the amount of current.

When the temperature of the wavelength conversion element 3 reaches the predetermined temperature as described above, the wavelength of the light emitted from the laser light source 2 is converted. The light including the inverted wavelength is emitted from the resonator structure.

In other words, after the initial driving of the laser light source, when there is a primary feedback from the photo-diode 9 to the control section 5, this means the wavelength conversion element 3 has reached the predetermined temperature.

Therefore, according to the above-described constitution, after the wavelength conversion element 3 has reached the predetermined temperature, due to decreasing the amount of current supplied to the laser light source 2, it is possible to quickly suppress and converge the overshoot amount of temperature. Thereby, it is possible to obtain quick illumination of the laser light.

Furthermore, since it is unnecessary to manage the temperature of the wavelength conversion element 3 at the driving of the laser light source device 1, it is possible to easily control the laser light source device 1.

In the above-described embodiment, the laser light source 2 is controlled so as to switch the drive currents Ia or Ib supplied to the laser light source 2 depending on the time at which the temperature of the wavelength conversion element 3 reaches the predetermined temperature as shown in FIG. 4.

However, other driving methods may by used. For example, after the temperature of the wavelength conversion element 3 has reached the predetermined temperature, due to gradually changing the value of the current supplied to the laser light source 2, and due to smoothly changing the value of the current, the supply of the current may be decreased depending on the passage of time.

In addition, the driving method for the laser light source device 1 of the invention is not limited to the above embodiments, but various modifications may be made without departing from the spirit and scope of the invention.

In the above embodiment, the constitution in which the wavelength conversion element 3 is heated by the heater 6 is adopted. However, for example, without using the heater 6, the temperature of the wavelength conversion element 3 may be caused to reach the predetermined temperature by using the laser light source 2 alone.

Image Display Device

Figure 7:
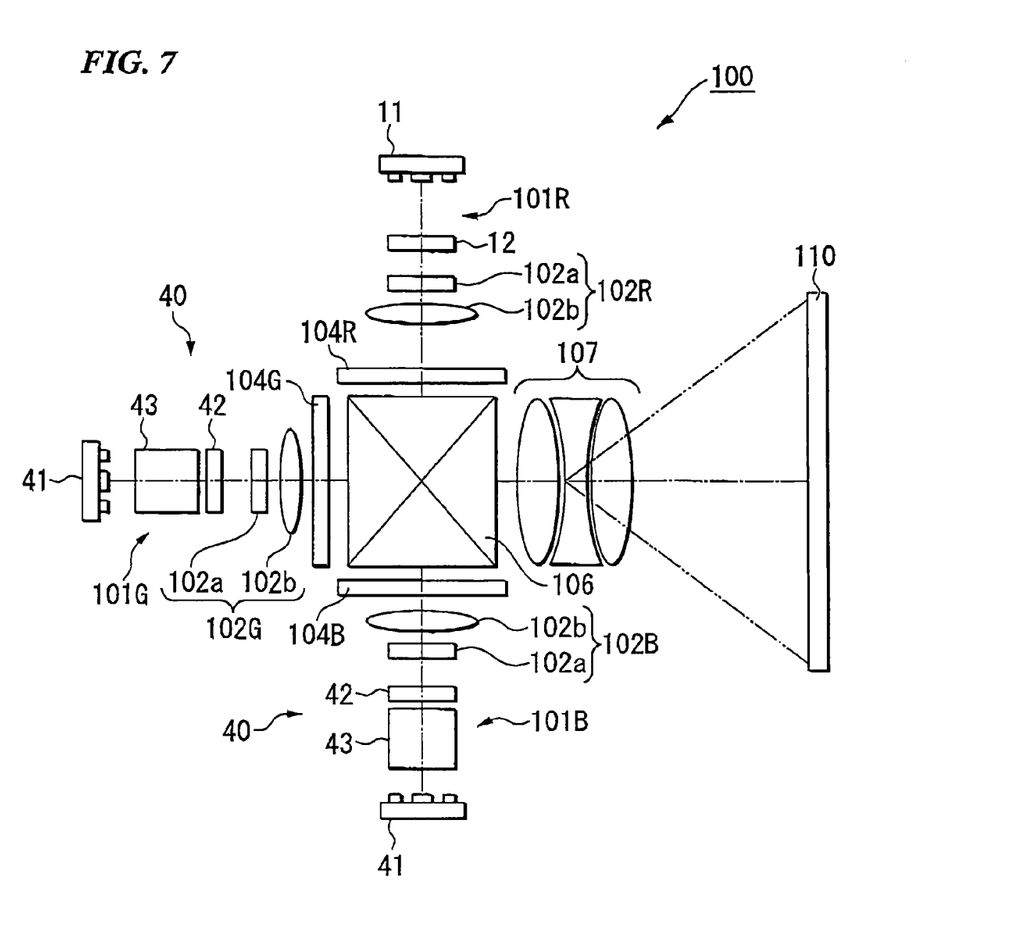
FIG. 7 is a view of an image display device of an embodiment of the invention.

Next, an image display device (projector) of an embodiment of the invention is explained referring FIG. 7.

In this embodiment, a image display device 100 including the laser light source device 1 of the above-described embodiment is explained The case which is a portion of the image display device 100 is omitted in FIG. 7 for simplicity.

An image display device 100 includes: laser light source devices 101R, 101G, and 101B, liquid crystal light valves (light modulation devices) 104R, 104G, and 104B, a cross dichroic prism (color synthesis optical system) 106, and a projection lens (projection device) 107.

The laser light source devices 101R, 101G, and 101B emit laser light.

The liquid crystal light valves 104R, 104G, and 104B modulate the laser light emitted from the laser light source devices 101R, 110G, and 101B, respectively.

The cross dichroic prism 106 synthesizes the light emitted from the liquid crystal light valves 104R, 104G, and 104B and leads the synthesized light to the projection lens 107.

The projection lens 107 enlarges the image formed by the liquid crystal light valves 104R, 104G, and 104B and projects the enlarged image onto screen 110.

Furthermore, in the image display device 100, in order to uniformize the illumination distribution of the laser light emitted from the laser light source devices 101R, 101G and 101B, uniforming optical systems 102R, 102G, and 102B are arranged at a downstream side of the laser light source devices 101R, 101G, and 101B in the of the optical path, respectively.

Therefore, the light including the uniformed illumination distribution is illuminated onto the liquid crystal light valves 104R, 104G, and 104B.

For example, the uniforming optical systems 102R, 102G, and 102B are constituted, for example, by a hologram element 102a and a field lens 103b.

Three colored lights modulated by the liquid crystal light valves 104R, 104G, and 104B are incident onto the cross dichroic prism 106.

This cross dichroic prism. 106 is formed by affixing together four rectangular prisms. On its inner surface, a dielectric multilayered film that reflects red colored light and a dielectric multilayered film that reflects blue colored light are disposed in a cross shape.

Light of three colors is synthesized by these dielectric multilayered firm, and light expressing colored images is formed.

Moreover, the synthesized light is projected on the screen 110 by the projection lens 107, which is the projection optical system, and an enlarged image is displayed.

Since the image display device 100 includes the laser light source devices 101R, 101G, and 101B in which it is possible to obtain the desired amount of light in a short time, it is possible to quickly display the images in the image display device 100 itself.

Furthermore, as the light modulation device, the transmission-type liquid crystal light valves 104R, 104G, and 104B are used in this embodiment, but other types of light valve than the liquid crystal may be used. A reflection-type light valve may be used.

As such a light valve, for example, reflection-type liquid crystal light valves 104R, 104G, and 104B or a Digital Micromirror Device may be used.

The constitution of the projection optical system is appropriately modified depending on the kind of light valve used.

Monitor Device

Figure 8:
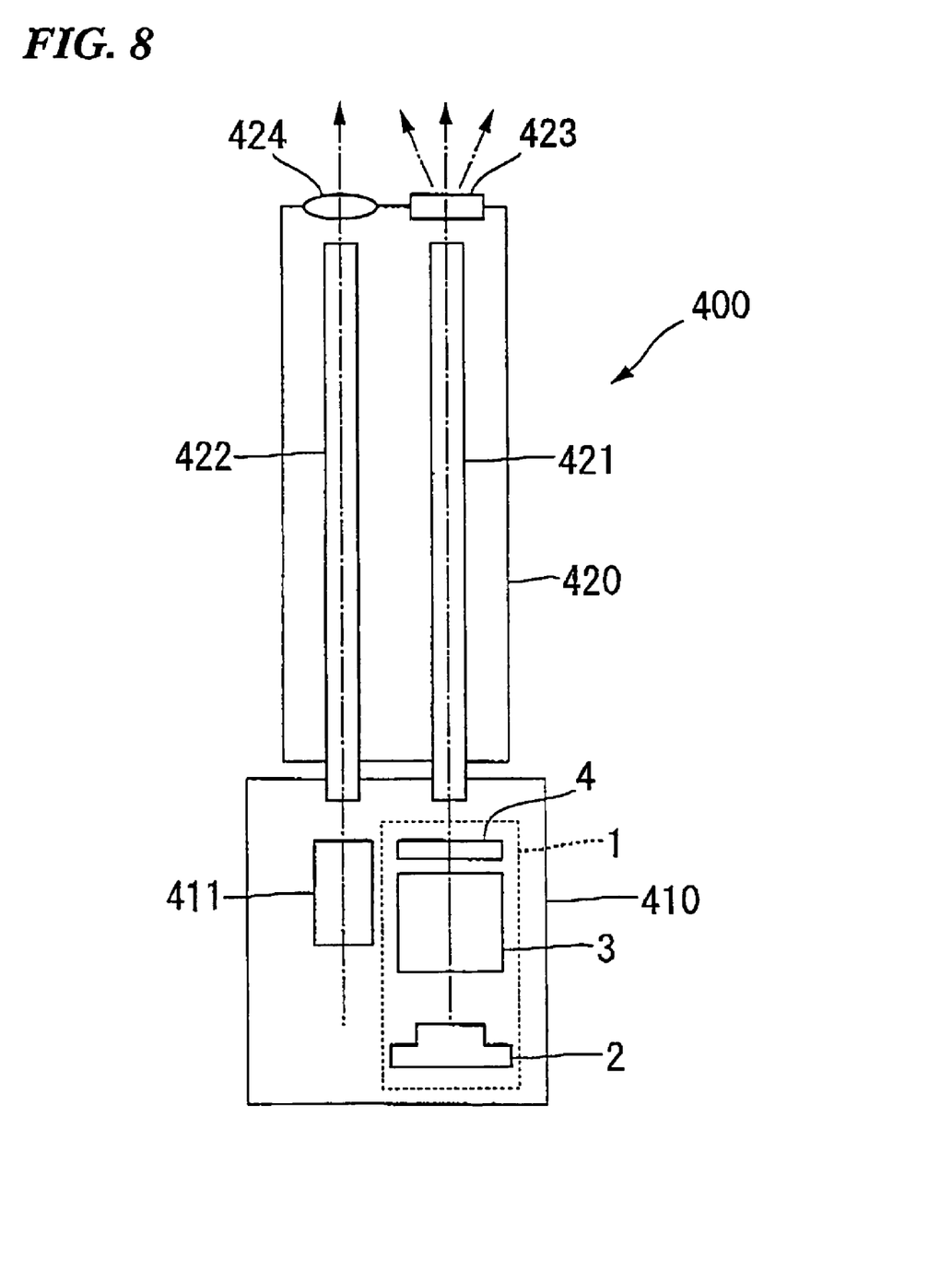
FIG. 8 is a view of a monitor device of an embodiment of the invention.

Next, as a monitor device of an embodiment of the invention, an example is described of a constitution of a monitor device 400 to which the above-described laser light source device 1 is applied.

FIG. 8 is a schematic view of a monitor device.

The monitor device 400 includes a main body 410 and a light transmission section 420.

The main body 410 includes the above-described laser light source device 1.

The light transmission section 420 includes two light guides 421 and 422. The light guide 421 transmits the light. The light guide 422 receives the light.

Each of the light guides 421 and 422 is constituted from a plurality of optical fibers that are sheaved. It is possible to transmit the laser light to a distance by using the light guides 421 and 422.

The laser light source device is disposed at the incident side of the transmitting light guide 421. A diffusing plate (diffusing element) 423 is disposed at the emission side of the transmitting light guide 421.

The laser light emitted from the laser light source device 1 is transmitted through the light guide 421 and the diffusing plate 423 disposed at the end of the light transmission section 420, and is diffused by the diffusing plate 423. Therefore, the laser light illuminates an object.

Also, since an image-formation lens 424 is disposed at the end of the light transmission section 420, the image-formation lens 424 can receive the reflection light reflected by the object.

The reflection light that is received by the image-formation lens 424 is transmitted through the receiving light guide 422 and to a camera 411 (camera section) formed in the main body 410.

As a result, due to using the laser light emitted from the laser light source device 1, the object is illuminated, the reflection light reflected by the object is obtained, and the image formed from the reflection light can be taken by the camera 411.

In the monitor device 400 constituted as described above, since the laser light source device 1 can obtain the desired amount of light in a short time, it is possible to quickly illuminate (monitoring) onto an object. Therefore, in the monitor device 400, it is possible to quickly capture the taken images by the camera 411, achieving a high performance.

Illumination Device

Next, as an illumination device of an embodiment of the invention, an example is described of a constitution of an illumination device 500 to which the above-described laser light source device 1 is applied.

Figure 9:
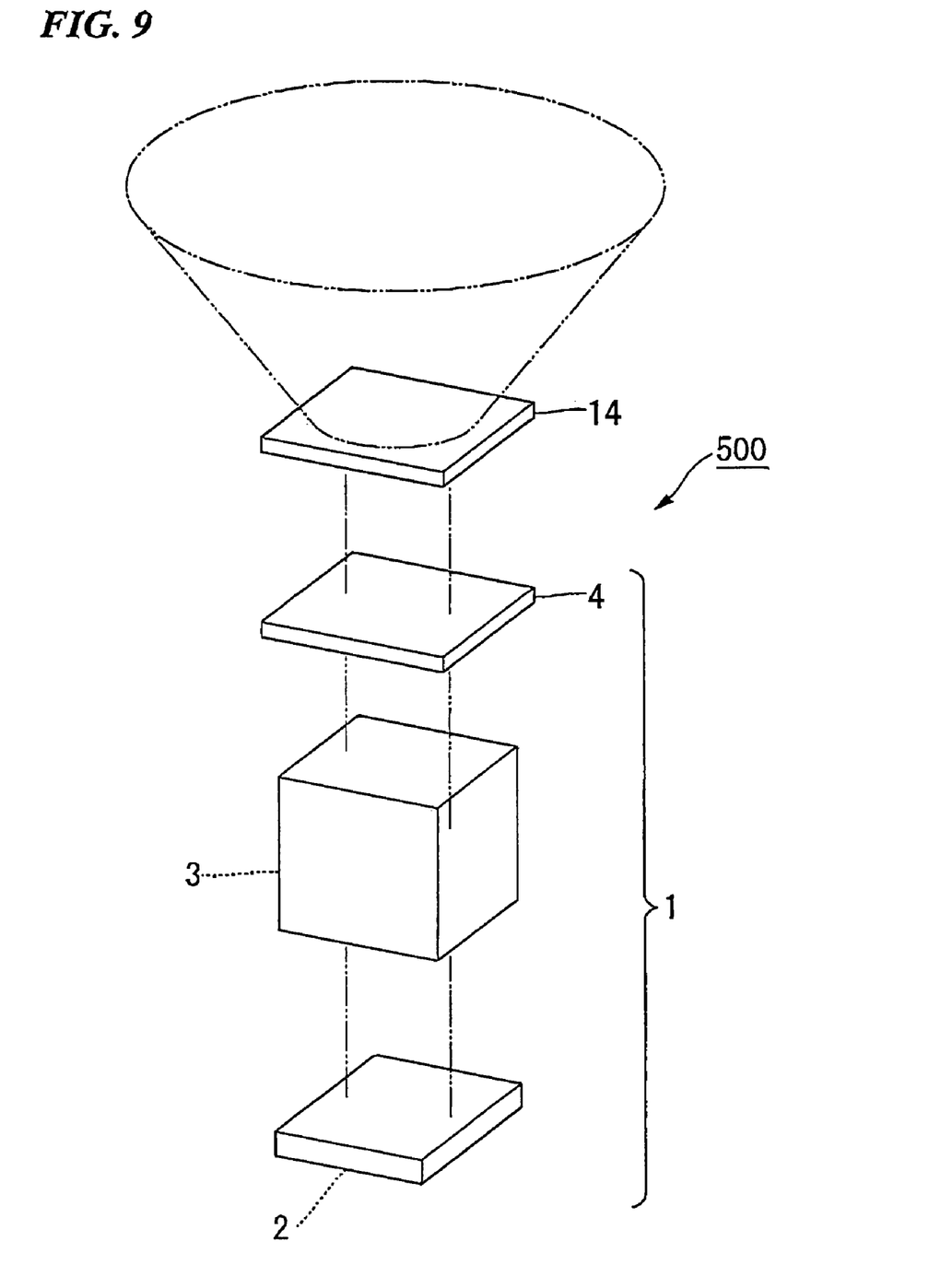
FIG. 9 is a view of an illumination device of an embodiment of the invention.

FIG. 9 is a schematic view of the illumination device 500.

As shown in FIG. 9, the illumination device 500 includes the laser light source device 1 of the above-described embodiment and a diffusing element 14 diffusing the light emitted from the laser light source device 1.

Since the illumination device 500 includes the laser light source device 1 in which it is possible to obtain the desired amount of light in a short time, the illumination device 500 itself can quickly illuminate the desired amount of light, achieving a high reliability.

The technical scope of this invention shall not be limited to the above embodiments. As a matter of course, the invention may include various modifications of the embodiment in a scope not deviating tom the spirit of this invention

What is claimed is:

1. A driving method for a laser light source device, comprising:

providing a laser light source device including a laser light source, a wavelength conversion element converting the wavelength of the light emitted from the laser light source, and a resonator mirror constituting a resonator structure between the laser light source and the resonator mirror;

driving the laser light source so as to cause the amount of light to decrease depending on the passage of time, compared with the amount of light by the initial driving of the laser light source;

heating the wavelength conversion element by the light emitted from the laser light source to which the electric current of the initial driving is supplied; and increasing the temperature in the wavelength conversion element so as to reach a predetermined temperature.

2. The driving method according to claim 1, further comprising:

using a heater to heat the wavelength conversion element when the driving of the laser light source.

3. The driving method according to claim 2, wherein the driving of the heater is controlled in accordance with the light emitted from the laser light source.

4. The driving method according to claim 1, further comprising:

detecting the temperature of the wavelength conversion element, wherein the detecting of the temperature of the wavelength conversion element is started when a predetermined electric current is supplied to the laser light source at the initial driving of the laser light source, and wherein the supply of the electric current to the light source is decreased before the temperature of the wavelength conversion element reaches the predetermined temperature.

5. The driving method according to claim 1, further comprising:

measuring the amount of light emitted from the resonator structure, wherein the measuring of the amount of light is started when a predetermined electric current is supplied to the laser light source at the initial driving of the laser light source, and wherein the supply of the electric current to the light source is decreased when the light emitted from the resonator structure is initially detected after the initial driving of the laser light source.

6. The driving method according to claim 2, wherein the heater is used when the initial driving of the laser light source.

7. The driving method according to claim 2, wherein
the heater is driven so that a degree of heating the wavelength conversion element decreases compared with the case of the initial driving of the laser light source when the temperature of the wavelength conversion element reaches the temperature at which the wavelength conversion element is able to convert the wavelength of the light emitted from the laser light source, and the degree of heating the wavelength conversion element increases compared with the stationary state after the wavelength conversion element 3 was in the stationary state.

8. The driving method according to claim 4, wherein
the wavelength conversion element is heated by the light emitted from the laser light source by supplying a high drive current to the laser light source at the initial driving of the laser light source, and the temperature of the wavelength conversion element is detected, and wherein
the current supplied to the laser light source is switched from the high drive current to a low drive current lower than the high drive current when the temperature of the wavelength conversion element reaches the temperature at which the wavelength conversion element is able to convert the wavelength of the light emitted from the laser light source.

9. The driving method according to claim 5, wherein
the wavelength conversion element is heated by the light emitted from the laser light source by supplying a high drive current to the laser light source at the initial driving of the laser light source, and the amount of light emitted from the resonator structure is measured, and wherein
the current supplied to the laser light source is switched from the high drive current to a low drive current lower than the high drive current when the light emitted from the resonator structure is primarily detected after the initial driving of the laser light source.

10. A laser light source device comprising:
a laser light source;
a wavelength conversion element converting the wavelength of the light emitted from the laser light source;
a resonator mirror constituting a resonator structure between the laser light source and the resonator mirror;
a control section controlling the light emitted from the laser light source so as to cause the amount of light to decrease depending on the passage of time, compared with the amount of light by the initial driving of the laser light source, so that the wavelength conversion element is heated by the laser light emitted from the laser light source to which the electric current of the initial driving is supplied and the temperature in the wavelength conversion element increases so as to reach a predetermined temperature.

11. An image display device comprising:
the laser light source device according to claim 10;
a light modulation device modulating the light emitted from the laser light source device in accordance with an image signal; and
a projection device projecting an image formed by the light modulation device.

12. A monitor device comprising:
a main body having the laser light source device according to claim 10; and
a light transmission section transmitting the light emitted from the main body to an exterior of the light transmission section, and transmitting reflected light of the exterior of the light transmission section to the main body.

13. An illumination device comprising:
the laser light source device according to claim 10; and
a diffusing element diffusing laser light.

* * * * *